United States Patent
Kamiya et al.

(10) Patent No.: US 12,304,984 B2
(45) Date of Patent: May 20, 2025

(54) COMPOSITION CONTAINING FLUORINE-CONTAINING POLYMER AND CROSSLINKED ARTICLE

(71) Applicant: DAIKIN INDUSTRIES, LTD., Osaka (JP)

(72) Inventors: Fumihiro Kamiya, Osaka (JP); Tsuyoshi Noguchi, Osaka (JP)

(73) Assignee: DAIKIN INDUSTRIES, LTD., Osaka (JP)

(*) Notice: Subject to any disclaimer, the term of this patent is extended or adjusted under 35 U.S.C. 154(b) by 540 days.

(21) Appl. No.: 17/716,529

(22) Filed: Apr. 8, 2022

(65) Prior Publication Data

US 2022/0227909 A1   Jul. 21, 2022

Related U.S. Application Data

(63) Continuation of application No. PCT/JP2020/038043, filed on Oct. 7, 2020.

(30) Foreign Application Priority Data

Oct. 9, 2019 (JP) .................. 2019-185820

(51) Int. Cl.
C08F 214/26 (2006.01)
C08K 3/36 (2006.01)
C09K 3/10 (2006.01)

(52) U.S. Cl.
CPC ............ *C08F 214/262* (2013.01); *C08K 3/36* (2013.01); *C09K 3/1009* (2013.01); *C08F 2810/20* (2013.01); *C09K 2200/0247* (2013.01); *C09K 2200/0637* (2013.01)

(58) Field of Classification Search
CPC .... C08F 214/262; C08F 2810/20; C08K 3/36; C09K 3/1009; C09K 2200/0247
See application file for complete search history.

(56) References Cited

U.S. PATENT DOCUMENTS

| | | | | |
|---|---|---|---|---|
| 6,632,871 | B1 * | 10/2003 | Tanaka ...................... | C08K 9/02 525/379 |
| 2005/0004298 | A1 | 1/2005 | Tanaka et al. | |
| 2009/0117463 | A1 | 5/2009 | Takezawa et al. | |
| 2012/0145966 | A1 * | 6/2012 | Hsu ............................ | C08J 3/03 977/932 |
| 2013/0202878 | A1 * | 8/2013 | Carella .................... | C08K 3/22 29/897.3 |
| 2017/0155116 | A1 * | 6/2017 | Kobayashi .......... | H01M 10/054 |

FOREIGN PATENT DOCUMENTS

| | | |
|---|---|---|
| JP | 2009-135084 A | 6/2009 |
| JP | 2014-144884 A | 8/2014 |
| WO | 00/78871 A1 | 12/2000 |

OTHER PUBLICATIONS

International Search Report for PCT/JP2020/038043 dated Dec. 15, 2020.
International Preliminary Report on Patentability dated Apr. 12, 2022 with a Translation of the Written Opinion of the International Searching Authority in Application No. PCT/JP2020/038043.
Extended European Search Report dated Sep. 7, 2023 in Application No. 20874693.3.

* cited by examiner

*Primary Examiner* — John E Uselding
(74) *Attorney, Agent, or Firm* — Sughrue Mion, PLLC

(57) ABSTRACT

A composition containing a fluorine-containing polymer and a silicon oxide represented by formula: $SiO_x$, where $0<x<2$. In a preferred embodiment, the composition contains a cross-linking agent. Also disclosed is a crosslinked product which may be a sealing material obtained by crosslinking the composition.

4 Claims, No Drawings

COMPOSITION CONTAINING FLUORINE-CONTAINING POLYMER AND CROSSLINKED ARTICLE

CROSS-REFERENCE TO RELATED APPLICATIONS

This application is a Rule 53(b) Continuation of International Application No. PCT/JP2020/038043 filed Oct. 7, 2020, which claims priority based on Japanese Patent Application No. 2019-185820 filed Oct. 9, 2019, the respective disclosures of which are incorporated herein by reference in their entirety.

TECHNICAL FIELD

The present disclosure relates to a composition comprising a fluorine-containing polymer and to a crosslinked product.

BACKGROUND ART

Since a composition comprising a fluorine-containing polymer such as a fluorine-containing elastomer is excellent in heat resistance, chemical resistance, solvent resistance, fuel oil resistance and the like, it is widely used for producing a molded article such as O-rings, hoses, stem seals, shaft seals, and diaphragms. As such a composition, for example, Patent Literature 1 proposes a crosslinkable elastomer composition comprising a crosslinkable elastomer component and silicon oxide fine particles, wherein the silicon oxide fine particles have $100 \times 10^{19}$ hydroxyl groups/g or less on the surface thereof and have an average particle size of 0.5 µm or less.

CITATION LIST

Patent Literature

Patent Literature 1: International Publication No. 00/078871

SUMMARY

According to the present disclosure, there is provided a composition comprising a fluorine-containing polymer and a silicon oxide represented by formula: $SiO_x$, where $0<x<2$.

EFFECTS

According to the present disclosure, it is possible to provide a novel composition containing a specific silicon oxide.

DESCRIPTION OF EMBODIMENTS

Hereinafter, specific embodiments of the present disclosure will be described in detail, but the present disclosure is not limited to the following embodiments.

A composition of the present disclosure contains a fluorine-containing polymer and a silicon oxide represented by formula: $SiO_x$, where $0<x<2$. The composition of the present disclosure can adsorb oxygen in the air by containing the above-mentioned silicon oxide. Therefore, by using the composition of the present disclosure for producing a crosslinked product such as a sealing material or the like of an apparatus including a sealed space such as a semiconductor manufacturing apparatus, oxygen in the sealed space can be adsorbed to reduce the oxygen concentration in the sealed space, and oxygen can be prevented from entering the sealed space from the outside. Furthermore, the composition of the present disclosure contains a fluorine-containing polymer, and thus it is possible to obtain a crosslinked product having excellent heat resistance and plasma resistance.

The silicon oxide is an oxide containing a silicon atom. The silicon oxide represented by formula: $SiO_x$ where $0<x<2$ is a compound having a compositional feature deviated from stoichiometric compositional features, and may be referred to as a non-stoichiometric compound.

The constituent ratio of Si in the silicon oxide as the filler (Si/(Si+O)), as specified by X-ray photoelectron spectroscopy (ESCA) of the silicon oxide, is preferably 35 to 90 atom %, more preferably 37 atom % or more, further preferably 39 atom % or more, more preferably 80 atom % or less, and further preferably 70 atom % or less.

The constituent ratio of Si in the silicon oxide (Si/(Si+O)) can be calculated by the following method using a value obtained by X-ray photoelectron spectroscopy (ESCA) of the silicon oxide.

Constituent ratio (Si/(Si+O))=A/B
A: Peak area value of Si element
B: Total value of peak area values of Si element and O element The particle size of the silicon oxide is preferably less than 200 µm, more preferably 5 to 100 nm. The particle size of the silicon oxide can be determined by converting the specific surface area measured by measuring the specific surface area of the silicon oxide into the particle size.

The silicon oxide is preferably produced by a thermal plasma method, and more preferably obtained by supplying silicon powder to a thermal plasma flame. By supplying silicon powder to the thermal plasma flame, the supplied silicon powder is subjected to thermal plasma treatment to form silicon oxide. The compositional feature of the silicon powder is adjusted according to the desired compositional feature of the silicon oxide. The thermal plasma flame is preferably derived from at least one gas selected from the group consisting of hydrogen gas, nitrogen gas, helium gas, and argon gas, and more preferably derived from a mixed gas of hydrogen gas and argon gas. The temperature of the thermal plasma flame is, for example, 2000 to 3000° C. The pressure of the thermal plasma treatment is preferably atmospheric pressure or less. The silicon powder can be supplied to the thermal plasma flame by using, for example, argon gas as a carrier gas.

The silicon oxide can be produced, for example, by a method for producing silicon oxide particles comprising a step of preparing a stoichiometric silicon oxide powder and at least one powder of a silicon powder, a powder of a compound of an element other than oxygen and silicon, and a powder of a non-stoichiometric silicon oxide, and a step of supplying the stoichiometric silicon oxide powder and the at least one powder which is prepared into a thermal plasma flame. Examples of such a production method include the production method described in Japanese Patent Laid-Open No. 2014-144884.

In the production method, the powder such as silicon powder acts as a reducing agent to the stoichiometric silicon oxide powder, and the stoichiometric silicon oxide powder is partially reduced by the thermal plasma flame to become the above-described silicon oxide. Oxygen generated by the reduction of the stoichiometric silicon oxide powder is bonded to the silicon element of the silicon powder to faun the above-described silicon oxide, but since oxygen sufficient to form the stoichiometric silicon oxide is not obtained as there is no oxygen not supplied from the outside, the above-described silicon oxide is famed. In this manner, the above-described silicon oxide particles are considered to be foiled from any of the stoichiometric silicon oxide powder and the powder such as silicon powder.

The content of the silicon oxide in the composition of the present disclosure is preferably 0.1 to 100 parts by mass, more preferably 0.5 parts by mass or more, further preferably 1.0 parts by mass or more, particularly preferably 5 parts by mass or more, and more preferably 50 parts by mass or less, further preferably 30 parts by mass or less, particularly preferably 25 parts by mass or less, with respect to 100 parts by mass of the fluorine-containing polymer.

For the composition of the present disclosure, a rate of weight increase when a temperature of a crosslinked product obtained by crosslinking the composition is increased from normal temperature to 400° C. at a rate of 10° C./min by heating the crosslinked product in air is preferably 0.1% or more. The rate of weight increase of the composition of the present disclosure is preferably 0.2% or more, more preferably 0.3% or more. Since a larger rate of weight increase is preferred, the upper limit is not limited, but the fluorine-containing polymer contained in the composition of the present disclosure has excellent heat resistance and hardly increases in weight upon heating. Therefore, the rate of weight increase in the range that can be easily realized and can sufficiently enjoy the excellent properties of the fluorine-containing polymer is usually 2% or less, and preferably 1% or less.

The rate of weight increase of the crosslinked product can be determined by the following method. A composition containing a fluorine-containing polymer is crosslinked by a known method, and a sample having a thickness of 2 mm is produced from the obtained crosslinked product. About 10 mg of the sample is heated in an air atmosphere to increase the temperature of the sample from normal temperature to 400° C. or higher at a rate of 10° C./min, and the weight at the time when the temperature reaches 400° C. is measured using a simultaneous thermogravimetry/differential thermal analyzer. Next, the initial weight is subtracted from the weight at the time when the temperature reaches 400° C. to calculate the weight increase at the time when the temperature reaches 400° C. Then, as the rate of weight increase, the proportion (%) of the weight increase amount at the time when the temperature reaches 400° C. with respect to the initial weight is calculated.

In the present disclosure, the weight of the sample measured at normal temperature is used as a reference for calculating the rate of weight increase, and the sample is heated from normal temperature to 400° C. for measuring the weight of the sample when the temperature reaches 400° C. In the present disclosure, the normal temperature may be a temperature in the range of 10 to 40° C. The temperature range of 10 to 40° C. does not significantly affect the calculated value.

The fluorine-containing polymer has excellent heat resistance, and usually does not oxidize or decompose even when heated to the above temperature, so that the weight of the crosslinked product does not usually change. However, the crosslinked product obtained from the composition of the present disclosure has a feature that the weight is increased upon heating in the air, and this feature provides a surprising effect that oxygen in the air can be adsorbed.

The rate of weight increase of the composition can be adjusted, for example, by adjusting the content of the silicon oxide.

The composition of the present disclosure contains a fluorine-containing polymer. The fluorine-containing polymer is preferably a fluorine-containing elastomer because of its excellent sealability, chemical resistance and heat resistance.

In the present disclosure, the fluorine-containing elastomer is an amorphous fluorine-containing polymer. "Amorphous" refers to a state in which the melting peak ($\Delta H$) that appears in differential scanning calorimetry [DSC] (temperature-increasing rate 10° C./min) or differential thermal analysis [DTA] (temperature-increasing rate 10° C./min) of the fluorine-containing polymer is 4.5 J/g or less. Fluorine-containing elastomers exhibit elastomeric characteristics through cross-linking. "Elastomeric characteristics" means characteristics that allow the polymer to be stretched and to retain its original length when the force required to stretch the polymer is no longer applied.

The fluorine-containing elastomer may be a partially fluorinated elastomer or a perfluoroelastomer, but it is preferable to use a perfluoroelastomer from the viewpoint of having even better chemical resistance and heat resistance.

In the present disclosure, the partially fluorinated elastomer is a fluorine-containing polymer that includes a fluoromonomer unit, has a perfluoromonomer unit content of less than 90 mol % with respect to all the polymerization units, has a glass transition temperature of 20° C. or lower, and has a melting peak ($\Delta H$) of 4.5 J/g or less.

In the present disclosure, the perfluoroelastomer is a fluorine-containing polymer that has a perfluoromonomer unit content with respect to all the polymerization units of 90 mol % or more, has a glass transition temperature of 20° C. or lower, and has a melting peak ($\Delta H$) of 4.5 J/g or less, and further, has a fluorine atom concentration in the fluorine-containing polymer of 71% by mass or more. In the present disclosure, the fluorine atom concentration in the fluorine-containing polymer is determined by calculating the concentration (% by mass) of the fluorine atoms included in the fluorine-containing polymer from the type and content of each monomer constituting the fluorine-containing polymer.

In the present disclosure, the perfluoromonomer is a monomer that does not include a carbon atom-hydrogen atom bond in the molecule. The perfluoromonomer may be a monomer in which, in addition to carbon atoms and fluorine atoms, some of the fluorine atoms bonded to carbon atoms are replaced with chlorine atoms, and may have, other than carbon atoms, a nitrogen atom, an oxygen atom, and a sulfur atom. The perfluoromonomer is preferably a monomer in which all the hydrogen atoms are replaced with fluorine atoms. A monomer that provides a crosslinking site does not fall within the scope of the perfluoromonomer.

Examples of the partially fluorinated elastomer include vinylidene fluoride (VdF)-based fluoroelastomers, tetrafluoroethylene (TFE)/propylene (Pr)-based fluoroelastomers, tetrafluoroethylene (TFE)/propylene/vinylidene fluoride (VdF)-based fluoroelastomers, ethylene/hexafluoropropylene (HFP)-based fluoroelastomers, ethylene/hexafluoropropylene (HFP)/vinylidene fluoride (VdF)-based fluoroelastomers, ethylene/hexafluoropropylene (HFP)/tetrafluoroethylene (TFE)-based fluoroelastomers, and the like. Among these, at least one selected from the group consisting of vinylidene fluoride-based fluoroelastomers and tetrafluoroethylene/propylene-based fluoroelastomers is preferable.

The vinylidene fluoride-based fluoroelastomer is preferably a copolymer comprising 45 to 85 mol % of vinylidene fluoride and 55 to 15 mol % of at least one other monomer copolymerizable with vinylidene fluoride. Preferably, the vinylidene fluoride-based fluoroelastomer is a copolymer comprising 50 to 80 mol % of vinylidene fluoride and 50 to 20 mol % of at least one other monomer copolymerizable with vinylidene fluoride.

In the present disclosure, the content of each monomer constituting the fluorine-containing polymer can be calculated by appropriately combining NMR, FT-IR, elemental analysis, and X-ray fluorescence analysis according to the type of monomer.

Examples of the at least one other monomer copolymerizable with vinylidene fluoride include TFE, HFP, fluoroalkyl vinyl ether, chlorotrifluoroethylene (CTFE), trifluoroethylene, trifluoropropylene, pentafluoropropylene, trifluorobutene, tetrafluoroisobutene, hexafluoroisobutene, vinyl fluoride, a fluoromonomer represented by formula (11): $CHX^{11}=CX^{11}Rf^{11}$ wherein of two $X^{11}$, one is H and the other is F, and $Rf^{11}$ is a linear or branched fluoroalkyl group having 1 to 12 carbon atoms, and a fluoromonomer represented by formula (12): $CH_2=CH-(CF_2)_n-X^{12}$ wherein $X^{12}$ is H or F, and n is an integer of 3 to 10; a monomer that provides a crosslinking site; and a non-fluorinated monomer such as ethylene, propylene, and alkyl vinyl ether. These can be used alone or in any combination. Among these, it is preferable to use at least one selected from the group consisting of TFE, HFP, fluoroalkyl vinyl ether and CTFE.

The fluoroalkyl vinyl ether is preferably at least one selected from the group consisting of a fluoromonomer represented by formula (13):

$$CF_2=CF-ORf^{13}$$

wherein $Rf^{13}$ represents a perfluoroalkyl group having 1 to 8 carbon atoms;
a fluoromonomer represented by formula (14):

$$CF_2=CFOCF_2ORf^{14}$$

wherein $Rf^{14}$ is a linear or branched perfluoroalkyl group having 1 to 6 carbon atoms, a cyclic perfluoroalkyl group having 5 to 6 carbon atoms, or a linear or branched perfluorooxyalkyl group having 2 to 6 carbon atoms including 1 to 3 oxygen atoms; and
a fluoromonomer represented by formula (15):

$$CF_2=CFO(CF_2CF(Y^{15})O)_m(CF_2)_nF$$

wherein $Y^{15}$ represents a fluorine atom or a trifluoromethyl group, m is an integer of 1 to 4, and n is an integer of 1 to 4.

More preferably, the fluoroalkyl vinyl ether is a fluoromonomer represented by formula (13).

Specific examples of the vinylidene fluoride-based fluoroelastomer include a VdF/HFP-based rubber, a VdF/HFP/TFE-based rubber, VdF/CTFE-based rubber, a VdF/CTFE/TFE-based rubber, a VdF/fluoromonomer represented by formula (11)-based rubber, a VdF/fluoromonomer represented by formula (11)/TFE-based rubber, a VdF/perfluoro (methyl vinyl ether) [PMVE]-based rubber, a VdF/PMVE/TFE-based rubber, a VdF/PMVE/TFE/HFP-based rubber and the like. The VdF/fluoromonomer represented by formula (11)-based rubber is preferably a VdF/$CH_2=CFCF_3$-based rubber, and the VdF/fluoromonomer represented by formula (11)/TFE-based rubber is preferably VdF/TFE/$CH_2=CFCF_3$-based rubber.

The VdF/$CH_2=CFCF_3$-based rubber is preferably a copolymer comprising 40 to 99.5 mol % of VdF and 0.5 to 60 mol % of $CH_2=CFCF_3$, and more preferably 50 to 85 mol % of VdF and 15 to 50 mol % of $CH_2=CFCF_3$.

The tetrafluoroethylene/propylene-based fluoroelastomer is preferably a copolymer comprising 45 to 70 mol % of tetrafluoroethylene, 55 to 30 mol % of propylene, and 0 to 5 mol % of fluoromonomer that provides a crosslinking site.

The fluorine-containing elastomer may be a perfluoroelastomer. Examples of the perfluoroelastomer include at least one selected from the group consisting of a perfluoroelastomer including TFE, for example, a copolymer of TFE/fluoromonomer monomer represented by formula (13), (14), or (15), and a copolymer of TFE/fluoromonomer monomer represented by formula (13), (14), or (15)/monomer providing a crosslinking site.

In the case of a TFE/PMVE copolymer, the compositional features thereof are preferably 45 to 90/10 to 55 (mol %), more preferably 55 to 80/20 to 45, and further preferably 55 to 70/30 to 45.

In the case of a copolymer of TFE/PMVE/monomer that provides a crosslinking site, the compositional features thereof are preferably 45 to 89.9/10 to 54.9/0.01 to 4 (mol %), more preferably 55 to 77.9/20 to 49.9/0.1 to 3.5, and further preferably 55 to 69.8/30 to 44.8/0.2 to 3.

In the case of a copolymer of TFE/fluoromonomer represented by formula (13), (14), or (15) having 4 to 12 carbon atoms, the compositional features thereof are preferably 50 to 90/10 to 50 (mol %), more preferably 60 to 88/12 to 40, and further preferably 65 to 85/15 to 35.

In the case of a copolymer of TFE/fluoromonomer represented by formula (13), (14), or (15) having 4 to 12 carbon atoms/monomer that provides a crosslinking site, the compositional features thereof are preferably 50 to 89.9/10 to 49.9/0.01 to 4 (mol %), more preferably 60 to 87.9/12 to 39.9/0.1 to 3.5, and further preferably 65 to 84.8/15 to 34.8/0.2 to 3.

If the compositional features of these copolymers are beyond these ranges, their nature as a rubber elastic body is lost, and the copolymer tends to have a nature close to that of a resin.

Examples of the perfluoroelastomer include at least one selected from the group consisting of a copolymer of TFE/fluoromonomer represented by formula (15)/monomer that provides a crosslinking site, a copolymer of TFE/fluoromonomer represented by formula (15), a copolymer of TFE/fluoromonomer represented by formula (13), and a copolymer of TFE/fluoromonomer represented by formula (13)/monomer that provides a crosslinking site.

Examples of the perfluoroelastomer may include the perfluoroelastomers described in International Publication No. WO 97/24381, Japanese Patent Publication No. 61-57324, Japanese Patent Publication No. 4-81608, Japanese Patent Publication No. 5-13961, and the like.

The monomer that provides a crosslinking site is a monomer (cure site monomer) having a crosslinkable group that provides the fluorine-containing polymer with a crosslinking site for forming a crosslink by a cross-linking agent.

Examples of the monomer that provides a crosslinking site include monomers represented by formula (16):

$$CX^4_2=CX^5R_fX^6$$

wherein $X^4$ and $X^5$ are each independently H, F, or an alkyl group having 1 to 5 carbon atoms, R is a linear or branched alkylene group or oxyalkylene group which may have one or more ether-bonding oxygen atoms, which may have an aromatic ring, and in which a part or all of its hydrogen atoms may be replaced with fluorine atoms, and $X^6$ is an iodine atom, a bromine atom, a nitrile group, a carboxyl group, an alkoxycarbonyl group, a hydroxyl group, a vinyl group, an azide group, a sulfonyl azide group, a carbonyl azide group, or an alkyne group. The alkyne group may be an ethynyl group.

The monomer that provides a crosslinking site is preferably, from among the following, at least one selected from the group consisting of:

a fluoromonomer represented by formula (17):

$$CX^{16}_2=CX^{16}-Rf^{16}X^{17}$$

wherein each $X^{16}$ is independently a hydrogen atom, a fluorine atom, or $CH_3$, $Rf^{16}$ is a fluoroalkylene group, a perfluoroalkylene group, a fluoro(poly)oxyalkylene group, or a perfluoro(poly)oxyalkylene group, $R^{16}$ is a hydrogen atom or $CH_3$, and $X^{17}$ is an iodine atom or a bromine atom;

a fluoromonomer represented by formula (18):

$$CX^{16}_2=CX^{16}-X^{17}$$

wherein each $X^{16}$ is independently a hydrogen atom, a fluorine atom, or $CH_3$, $Rf^{17}$ is a fluoroalkylene group, a perfluoroalkylene group, a fluoro(poly)oxyalkylene group, or a perfluoro(poly)oxyalkylene group, and $X^{17}$ is an iodine atom or a bromine atom;

a fluoromonomer represented by formula (19):

$$CF_2=CFO(CF_2CF(CF_3)O)_m(CF_2)_n-X^{18}$$

wherein m is an integer of 0 to 5, n is an integer of 1 to 3, and $X^{18}$ is a cyano group, an azide group, a sulfonyl azide group, a carbonyl azide group, a carboxyl group, an alkoxycarbonyl group, an alkyne group, an iodine atom, a bromine atom, or —$CH_2I$;

a fluoromonomer represented by formula (20):

$$CH_2=CFCF_2O(CF(CF_3)CF_2O)_m(CF(CF_3))_n-X^{19}$$

wherein m is an integer of 0 to 5, n is an integer of 1 to 3, and $X^{19}$ is a cyano group, a carboxyl group, an alkoxycarbonyl group, an iodine atom, a bromine atom, or —$CH_2OH$; and a monomer represented by formula (21):

$$CR^{20}_2=CR^{20}-Z-CR^{20}=CR^{20}_2$$

wherein each $R^{20}$ is independently a hydrogen atom or an alkyl group having 1 to 5 carbon atoms, and Z is a linear or branched alkylene group having 1 to 18 carbon atoms which may have an oxygen atom, a cycloalkylene group having 3 to 18 carbon atoms, an alkylene group or an oxyalkylene group having 1 to 10 carbon atoms which is at least partially fluorinated, or a (per)fluoropolyoxyalkylene group having a molecular weight of 500 to 10,000 and represented by $$-(Q)_p-CF_2O-(CF_2CF_2O)_m(CF_2O)_n-CF_2-(Q)_p-$$

wherein Q is an alkylene group or an oxyalkylene group, P is 0 or 1, and min is 0.2 to 5.

$X^{16}$ is preferably a fluorine atom. $Rf^{16}$ and $Rf^7$ are preferably a perfluoroalkylene group having 1 to 5 carbon atoms. $R^{16}$ is preferably a hydrogen atom. $X^{18}$ is preferably a cyano group, an alkoxycarbonyl group, an iodine atom, a bromine atom, or —$CH_2I$. $X^{19}$ is preferably a cyano group, an alkoxycarbonyl group, an iodine atom, a bromine atom, or —$CH_2OH$.

The monomer that provides the crosslinking site is preferably at least one selected from the group consisting of $CF_2=CFOCF_2CF(CF_3)OCF_2CF_2CN$, $CF_2=CFOCF_2CF(CF_3)OCF_2CF_2COOH$, $CF_2=CFOCF_2CF(CF_3)OCF_2CF_2CH_2I$, $CF_2=CFOCF_2CF_2CH_2I$, $CH_2=CFCF_2OCF(CF_3)CF_2OCF(CF_3)CN$, $CH_2=CFCF_2OCF(CF_3)CF_2OCF(CF_3)COOH$, $CH_2=CFCF_2OCF(CF_3)CF_2OCF(CF_3)CH_2OH$, $CH_2=CHCF_2CF_2I$, $CH_2=CH(CF_2)_2CH=CH_2$, $CH_2=CH(CF_2)_6CH=CH_2$, and $CF_2=CFO(CF_2)_5CN_2$, and more preferably at least one selected from the group consisting of $CF_2=CFOCF_2CF(CF_3)OCF_2CF_2CN$ and $CF_2=CFOCF_2CF_2CH_2I$.

From the viewpoint of excellent compression set at high temperature, the fluorine-containing elastomer has a glass transition temperature of preferably −70° C. or higher, more preferably −60° C. or higher, and further preferably −50° C. or higher. Further, from the viewpoint of good low-temperature resistance, the fluorine-containing elastomer has a glass transition temperature of preferably 5° C. or lower, more preferably 0° C. or lower, and further preferably −3° C. or lower.

The glass transition temperature is determined as follows: using a differential scanning calorimeter (DSC822e, manufactured by Mettler Toledo), a DSC curve is obtained by heating 10 mg of a sample at 10° C./min; and the temperature is read at the intermediate point of two intersections between each of the extension lines of the baselines before and after the secondary transition of the DSC curve and the tangent line at the inflection point of the DSC curve.

From the viewpoint of good heat resistance, the fluorine-containing elastomer has a Mooney viscosity MI (1+20) at 170° C. of preferably 30 or more, more preferably 40 or more, and further preferably 50 or more. Further, from the viewpoint of good processibility, the fluorine-containing elastomer has a Mooney viscosity ML of preferably 150 or less, more preferably 120 or less, and further preferably 110 or less.

From the viewpoint of good heat resistance, the fluorine-containing elastomer has a Mooney viscosity MI (1+20) at 140° C. of preferably 30 or more, more preferably 40 or more, and further preferably 50 or more. Further, from the viewpoint of good processability, the fluorine-containing elastomer has a Mooney viscosity ML of preferably 180 or less, more preferably 150 or less, and further preferably 110 or less.

From the viewpoint of good heat resistance, the fluorine-containing elastomer has a Mooney viscosity MI (1+10) at 100° C. of preferably 10 or more, more preferably 20 or more, and further preferably 30 or more. Further, from the viewpoint of good processability, the fluorine-containing elastomer has a Mooney viscosity ML of preferably 120 or less, more preferably 100 or less, and further preferably 80 or less.

The Mooney viscosity can be measured at 170° C., 140° C., or 100° C. according to JIS K6300 by using a Mooney viscometer MV2000E manufactured by ALPHA TECHNOLOGIES.

The above-described partially fluorinated elastomer and perfluoroelastomer can be produced by a conventional method. However, from the viewpoint of a narrow molecular weight distribution of the obtained polymer, easy control of the molecular weight, and being able to introduce an iodine atom or a bromine atom to a terminal, an iodine compound or a bromine compound can also be used as a chain transfer agent. Examples of a polymerization method pertained using an iodine compound or a bromine compound include a method in which emulsion polymerization is carried out in an aqueous medium under pressure in the presence of the iodine compound or the bromine compound in a substantially oxygen-free state (iodine transfer polymerization method). Typical examples of the iodine compound or bromine compound to be used include, for example, a compound represented by the formula:

$$R^{21}I_xBr_y$$

wherein x and y are each an integer of 0 to 2 and satisfy 1≤x+y≤2; and $R^{21}$ is a saturated or unsaturated fluorohydrocarbon group or chlorofluorocarbon group having 1 to 16 carbon atoms or a hydrocarbon group having 1 to 3 carbon atoms, which may contain an oxygen atom. By using an iodine compound or a bromine compound, an iodine atom or a bromine atom is introduced into the polymer to function as a cross-linking point.

Examples of the iodine compound and the bromine compound include 1,3-diiodoperfluoropropane, 2-iodoperfluoropropane, 1,3-diiodo-2-chloroperfluoropropane, 1,4-diiodoperfluorobutane, 1,5-diode-2,4-dichloroperfluoropentane, 1,6-diiodoperfluorohexane, 1,8-diiodoperfluorooctane, 1,12-diiodoperfluorododecane, 1,16-diiodineperfluorohexadecane, diiodomethane, 1,2-diiodoethane, 1,3-diiodo-n-propane, $CF_2Br_2$, $BrCF_2CF_2Br$, $CF_3CFBrCF_2Br$, $CFClBr_2$, $BrCF_2CFClBr$, $CFBrClCFClBr$, $BrCF_2CF_2CF_2Br$, $BrCF_2CFBrOF_3$, 1-bromo-2-iodoperfluoroethane, 1-bromo-3-iodoperfluoropropane, 1-bromo-4-iodoperfluorobutane, 2-bromo-3-iodoperfluorobutane, 3-bromo-4-iodoperfluorobutene-1, 2-bromo-4-iodoperfluorobutene-1, a monoiodomonobromo-substituted benzene, a diiodomonobromo-substituted benzene, and a (2-iodoethyl)-substituted benzene and a (2-bromoethyl)-substituted benzene, and the like. These compounds can be used alone or in combination together.

Among these, it is preferable to use 1,4-diiodoperfluorobutane, 1,6-diiodoperfluorohexane, or 2-iodoperfluoropropane from the viewpoint of polymerization reactivity, cross-linking reactivity, availability, and the like.

The above-described fluorine-containing polymer preferably has a cyano group. In particular, when a cage-type silsesquioxane is used as a cross-linking agent, the fluorine-containing polymer preferably has a cyano group. When the fluorine-containing polymer has a cyano group, the cage-type silsesquioxane acts as a cross-linking agent in a more suitable manner, and further, a crosslinked product having excellent heat resistance can be obtained.

The fluorine-containing polymer having a cyano group is preferably a fluorine-containing elastomer having a cyano group (—CN group) at a main chain terminal and/or in a side chain.

Examples of the fluorine-containing elastomer having a cyano group (—CN group) at a terminal of the main chain and/or in a side chain include a perfluoroelastomer and a partially fluorinated elastomer.

Examples of the perfluoroelastomer having a cyano group (—CN group) at a terminal of the main chain and/or in a side chain include, copolymers in which the monomer that provides a crosslinking site is a monomer having a cyano group (—CN group) among the above-described copolymers of TFE/fluoromonomer represented by formula (13), (14), or (15)/monomer that provides a crosslinking site. In this case, the content of the monomer unit having a cyano group (—CN group) may be 0.1 to 5 mol % with respect to the total amount of the TFE unit and the fluoromonomer unit represented by formula (13), (14), or (15), from the viewpoint of good crosslinking characteristics and heat resistance, and may even be 0.3 to 3 mol %. Even more preferable compositional features are as described above.

Further, examples of the monomer having a cyano group (—CN group) include monomers represented by the following formulas:

$$CY^1_2=CY^1(CF_2)_n—CN \qquad \text{Formula}$$

wherein each $Y^1$ is independently a hydrogen atom or a fluorine atom, and n is an integer of 1 to 8;

$$CF_2=CFCF_2Rf^8—CN \qquad \text{Formula}$$

wherein $Rf^8$ is $—(OCF_2)_n—$ or $—(OCF(CF_3))_n—$, and n is an integer of 0 to 5;

$$CF_2=CFCF_2(OCF(CF_3)CF_2)_m(OCH_2CF_2CF_2)_nOCH_2CF_2—CN \qquad \text{Formula}$$

wherein m is an integer of 0 to 5, and n is an integer of 0 to 5;

$$CF_2=CFCF_2(OCH_2CF_2CF_2)_m(OCF(CF_3)CF_2)_nOCF(CF_3)—CN \qquad \text{Formula}$$

wherein m is an integer of 0 to 5, and n is an integer of 0 to 5;

$$\text{Formula: } CF_2=CF(OCF_2CF(CF_3))_mO(CF_2)_n—CN \qquad \text{Formula}$$

wherein m is an integer of 0 to 5, and n is an integer of 1 to 8;

$$CF_2=CF(OCF_2CF(CF_3))_m—CN \qquad \text{Formula}$$

wherein m is an integer of 1 to 5;

$$CF_2=CFOCF_2(CF(CF_3)OCF_2)_nCF(—CN)CF_3 \qquad \text{Formula}$$

wherein n is an integer of 1 to 4;

$$CF_2=CFO(CF_2)_nOCF(CF_3)—CN \qquad \text{Formula}$$

wherein n is an integer of 2 to 5;

$$CF_2=CFO(CF_2)_n—(C_6H_4)—CN \qquad \text{Formula}$$

wherein n is an integer of 1 to 6;

$$CF_2=CF(OCF_2CF(CF_3))_nOCF_2CF(CF_3)—CN \qquad \text{Formula}$$

wherein n is an integer of 1 to 2;

$$CH_2=CFCF_2O(CF(CF_3)CF_2O)_nCF(CF_3)—CN \qquad \text{Formula}$$

wherein n is an integer of 0 to 5;

$$CF_2=CFO(CF_2CF(CF_3)O)_m(CF_2)_n—CN \qquad \text{Formula}$$

wherein m is an integer of 0 to 5, and n is an integer of 1 to 3;

$$CH_2=CFCF_2OCF(CF_3)OCF(CF_3)—CN; \qquad \text{Formula}$$

$$CH_2=CFCF_2OCH_2CF_2—CN; \qquad \text{Formula}$$

$$CF_2=CFO(CF_2CF(CF_3)O)_mCF_2CF(CF_3)—CN \qquad \text{Formula}$$

wherein m is an integer of 0 or more;

$$CF_2=CFOCF(CF_3)CF_3(CF_2)_n—CN \qquad \text{Formula}$$

wherein n is an integer of 1 or more; and $$CF_2=CFOCF_2OCF_2CF(CF_3)OCF_2—CN. \qquad \text{Formula}$$

These monomers can be used alone or in any combination.

Among the above, a monomer represented by the formula: $CF_2=CF(OCF_2CF(CF_3))_mO(CF_2)_n—CN$ wherein m is an integer of 0 to 5, n is an integer of 1 to 8; and $CF_2=CFOCF_2CF(CF_3)OCF_2CF_2CN$ is more preferable.

These perfluoroelastomers can be produced by a conventional method.

Specific examples of the perfluoroelastomer may include the fluoroelastomers described in International Publication No. WO 97/24381, Japanese Patent Publication No. 61-57324, Japanese Patent Publication No. 4-81608, Japanese Patent Publication No. 5-13961, and the like.

Examples of the partially fluorinated elastomer having a cyano group (—CN group) at a terminal of the main chain and/or in a side chain include vinylidene fluoride (VdF)- based fluoroelastomers, tetrafluoroethylene (TFE)/propylene-based fluoroelastomers, tetrafluoroethylene (TFE)/propylene/vinylidene fluoride (VdF)-based fluoroelastomers, ethylene/hexafluoropropylene (HFP)-based fluoroelastomers, ethylene/hexafluoropropylene (HFP)/vinylidene fluoride (VdF)-based fluoroelastomers, ethylene/hexafluoropropylene (HFP)/tetrafluoroethylene (TFE)-based fluoroelastomers, fluorinesilicone-based fluoroelastomers, fluorophosphazene fluoroelastomers, and the like. These can each be used alone, or in any combination as long as the effects of the present disclosure are not impaired.

The vinylidene fluoride-based fluoroelastomer is a fluorine-containing copolymer comprising 45 to 85 mol % of vinylidene fluoride and 55 to 15 mol % of at least one other monomer copolymerizable with vinylidene fluoride. Preferably, the vinylidene fluoride-based fluoroelastomer is a fluorine-containing copolymer comprising 50 to 80 mol % of vinylidene fluoride and 50 to 20 mol % of at least one other monomer copolymerizable with vinylidene fluoride.

Examples of the at least one other monomer copolymerizable with vinylidene fluoride include a fluoromonomer such as TFE, CTFE, trifluoroethylene, HFP, trifluoropropylene, tetrafluoropropylene, pentafluoropropylene, trifluorobutene, tetrafluoroisobutene, perfluoro(alkyl vinyl ether) (PAVE), and vinyl fluoride, and non-fluorinated monomers such as ethylene, propylene and alkyl vinyl ether. These can be used alone or in any combination. Among these, TFE, HFP, and perfluoro(alkyl vinyl ether) are preferable.

Specific examples of the rubber include VdF-HFP-based rubber, VdF-HFP-TFE-based rubber, VdF-CTFE-based rubber, VdF-CTFE-TFE-based rubber, and the like.

These partially fluorinated elastomers can be produced by a conventional method.

Further, as the fluorine-containing elastomer, a thermoplastic fluoroelastomer comprising an elastomeric fluorine-containing polymer chain segment and a non-elastomeric fluorine-containing polymer chain segment may be used.

The composition of the present disclosure preferably further contains a cross-linking agent. Examples of the cross-linking agent include cross-linking agents used in peroxide cross-linking, polyol cross-linking, polyamine cross-linking, triazine cross-linking, oxazole cross-linking, imidazole cross-linking, and thiazole cross-linking. When the fluorine-containing polymer is a fluorine-containing elastomer having a cyano group (—CN group) at a terminal of a main chain and/or in a side chain, the cross-linking agent is preferably at least one selected from the group consisting of an oxazole cross-linking agent, an imidazole cross-linking agent, and a thiazole cross-linking agent.

The cross-linking agent used for peroxide crosslinking may be any organic peroxide that can easily generate a peroxy radical in the presence of heat or a redox system. Specific examples include 1,1-bis(t-butylperoxy)-3,5,5-trimethylcyclohexane, 2,5-dimethylhexane-2,5-dihydroperoxide, di-t-butyl peroxide (Perbutyl D), t-butylcumyl peroxide (Perbutyl C), dicumyl peroxide (Percumyl D, Percumyl D-40, Percumyl D-40 MB(T)), α,α-bis(t-butylperoxy)-p-diisopropylbenzene, 2,5-dimethyl-2,5-di(t-butylperoxy)hexane (Perhexa 25B, Perhexa 25B-40), 2,5-dimethyl-2,5-di(t-butylperoxy)hexyne-3(Perhexyne 25B, Perhexyne 25B-40), benzoyl peroxide, t-butylperoxybenzene, 2,5-dimethyl-2,5-di(benzoylperoxy)hexane (Perhexa 25Z), t-butylperoxy maleate (t-butyl MA), t-butylperoxyisopropyl carbonate (Perbutyl 1-75), methyl ethyl ketone peroxide (Permek D (DR), Permek H (HR, HY), Permek N (NR, NY), Permek S (SR), Permek F (FR), Permek G (GR, GY)), cyclohexanone peroxide (Perhexa H), acetylacetone peroxide (Percure AH, AL), 1,1-di(t-hexylperoxy)-3,3,5-trimethylcyclohexane (Perhexa TMH), 1,1-di(t-hexylperoxy)cyclohexane (Perhexa HC), 1,1-di(t-butylperoxy)-2-methyl cyclohexane (Perhexa MC), 1,1-di(t-butylperoxy) cyclohexane (Perhexa C-80(S), Perhexa C-75(EB), Perhexa C(C), Perhexa C-40, Perhexa C-40 MB(S)), 2,2-di(t-butylperoxy)butane (Perhexa 22), butyl 4,4-di-(t-butylperoxy) pentanoate (Perhexa V, Perhexa V-40(F)), 2,2-di(4,4-di-(t-butylperoxy)cyclohexyl)propane (Pertetra p-menthane hydroperoxide (Permentha H), diisopropylbenzene hydroperoxide (Percumyl P), 1,1,3,3-tetramethylbutyl hydroperoxide (Perocta H), cumene hydroperoxide (Percumyl H-80), t-butyl hydroperoxide (Perbutyl H-69), di(2-t-butylperoxyisopropyl)benzene (Perbutyl P, Perbutyl P-40, Peroxymon F-40, Perbutyl P-40 MB(K)), di-t-hexyl peroxide (Perhexyl D), diisobutyryl peroxide (Peroyl IB), di(3,5,5-trimethylhexanoyl) peroxide (Peroyl 355(S)), dilauroyl peroxide (Peroyl L), disuccinic peroxide (Peroyl SA), a mixture of di-(3-methylbenzoyl) peroxide, benzoyl(3-methylbenzoyl) peroxide, and dibenzoyl peroxide (Nyper BMT-K40, Nyper BMT-M), dibenzoyl peroxide (Nyper BW, Nyper BO, Nyper FF, Nyper BS, Nyper E, Nyper NS), di(4-methylbenzoyl) peroxide (Nyper PMB), di-n-propyl peroxydicarbonate (Peroyl NPP-50M), diisopropyl peroxydicarbonate (Peroyl IPP-50, Peroyl IPP-27), di(4-t-butylcyclohexyl) peroxydicarbonate (Peroyl TCP), di(2-ethylhexyl) peroxydicarbonate (Peroyl OPP), di-sec-butylperoxydicarbonate (Peroyl SBP), cumyl peroxyneodecanoate (Percumyl ND, Percumyl ND-50E), 1,1,3,3-tetramethylbutylperoxyneodecanoate (Perocta ND, Perocta ND-50E), t-hexyl peroxyneodecanoate (Perhexyl ND, Perhexyl ND-50E), t-butylperoxyneodecanoate (Perbutyl ND, Perbutyl ND-50E), t-butylperoxy neoheptanoate (Perbutyl NHP), t-hexylperoxy pivalate (Perhexyl PV, Perhexyl PV-50E), t-butylperoxy pivalate (Perbutyl PV, Perbutyl PV-40E), 1,1,3,3-tetramethylbutylperoxy-2-ethyl hexanoate (Perocta O), 2,5-dimethyl-2,5-di(2-ethylhexanoylperoxy)hexane (Perhexa 25 O), t-hexyl peroxy-2-ethyl hexanoate (Perhexyl O, Percure HO(N)), t-butylperoxy-2-ethyl hexanoate (Perbutyl O, Percure O), t-hexyl peroxyisopropyl monocarbonate (Perhexyl I), t-butylperoxy-3,5,5-trimethyl hexanoate (Perbutyl 355), t-butylperoxy laurate (Perbutyl L), t-butylperoxy-2-ethylhexyl monocarbonate (Perbutyl E), t-hexyl peroxybenzoate (Perhexyl Z), t-butyl peroxyacetate (Perbutyl A), a mixture of t-butylperoxy-3-methyl benzoate and t-butylperoxy benzoate (Perbutyl ZT), t-butylperoxy benzoate (Perbutyl Z), t-butylperoxyallyl monocarbonate (peromer AC), 3,3',4,4'-tetra(t-butylperoxycarbonyl)benzophenone (BTTB-25), and 2,3-dimethyl-2,3-diphenylbutane (Nofmer BC-90). Preferred among these are dialkyl-type organic peroxides, and particularly preferred is 2,5-dimethyl-2,5-di(t-butylperoxy) hexane. Usually, the type and amount of the organic peroxide are selected in consideration of the amount of active —O—O—, the decomposition temperature, and the like.

Further, the cross-linking aid that can be used for peroxide crosslinking may be a compound having a reactivity with a peroxy radical and a polymer radical. Examples thereof include polyfunctional compounds having a functional group such as —CH=CH$_2$, —CH$_2$CH=CH$_2$, —CF=CF$_2$, —C(CF$_3$)=CF$_2$, —C(CH$_3$)=CF$_2$, —CF=CF(CF$_3$), —CF=CF(CH$_3$), —C(C$_6$H$_5$)=CF$_2$, —CF=CF(C$_6$H$_5$), —CH=CF$_2$, —CF=CHF, —C(CF$_3$)=CHF, —CF=CH (CF$_3$), —CH=CF(CF$_3$) and the like wherein "C$_6$H$_5$" represents a phenyl radical. Specific examples thereof include triallyl cyanurate, triallyl isocyanurate (TRIC), triacryl formal, triallyl trimerite, N,N'-n-phenylene bismaleimide, dipropargyl terephthalate, diallyl phthalate, tetraallyl terephthalate amide, triallyl phosphate, bismaleimide, fluorinated triallyl isocyanurate (1,3,5-tris(2,3,3-trifluoro-2-propenyl)-1,3,5-triazine 2,4,6-trione), tris(diallylamine)-S-triazine, triallyl phosphite, N,N-diallylacrylamide, 1,6-divinyldodecafluorohexane, and the like.

Further, examples of a cross-linking aid used together with the peroxide cross-linking agent include a compound represented by formula (31):

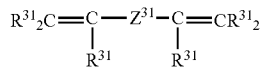

wherein each of the six $R^{31}$ is independently H, a halogen atom, or an optionally halogenated group having 1 to 5 carbon atoms in which an ether bond may be inserted, and $Z^{31}$ is an optionally halogenated linear or branched alkylene group or cycloalkylene group, or a (per)fluoropolyoxyalkylene group, each of which has 1 to 18 carbon atoms and optionally contains a hetero atom.

Examples of the compound represented by formula (31) include a compound represented by formula (32):

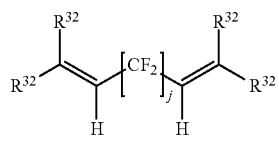

wherein j is an integer of 2 to 10, and preferably an integer of 4 to 8, and each of the four $R^{32}$ is independently H, F or an alkyl group or (per)fluoroalkyl group having 1 to 5 carbon atoms, a compound represented by formula (33):

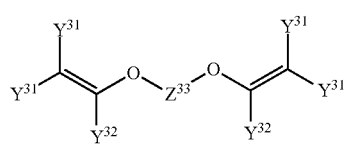

wherein each $Y^{31}$ is independently F, Cl, or H, each $Y^{32}$ is independently F, Cl, H, or $OR^{33}$, where $R^{33}$ is a branched or linear alkyl group that may be partially, substantially, or completely fluorinated or chlorinated, $Z^{33}$ is an optionally fluorinated divalent group having 2 to 10 carbon atoms in which an ether bond may be inserted, preferably $Z^{33}$ is a —$(CF_2)_m$— group in which m is an integer of 3 to 5, and the compound represented by formula (33) is preferably $F_2C$=$CF$—$O$—$(CF_2)_5$—$O$—$CF$=$CF_2$), and a compound represented by formula (34):

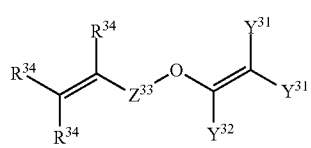

wherein $Y^{31}$, $Y^{32}$, and $Z^{33}$ are as defined above, and each $R^{34}$ is independently H, F, or an alkyl group or (per)fluoroalkyl group having 1 to 5 carbon atoms.

Examples of the cross-linking agent, or cross-linking aid used together with the peroxide cross-linking agent, include compounds having at least one structure represented by formula (35):

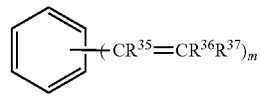

wherein $R^{35}$ to $R^{37}$ are each independently a hydrogen atom, a fluorine atom, an alkyl group, a fluorinated alkyl group, or a substituted or unsubstituted aryl group, and at least one of $R^{35}$ to $R^{37}$ is a fluorine atom or a group containing a fluorine atom; m is an integer of 1 to 5; when m is 2 or more, m-number of $R^{35}$ to $R^{37}$ may be the same or different with each other; and the hydrogen atoms of the benzene ring may be substituted. When m is 1, it is preferable to have two or more of the structures.

Examples of the compound having a structure represented by formula (36) include compounds represented by formula (36):

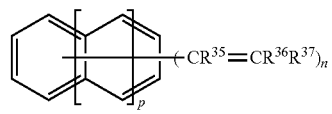

wherein $R^{35}$ to $R^{37}$ are as defined above; p is an integer of 0 to 2; and n is an integer of 2 to 6, compounds represented by formula (37):

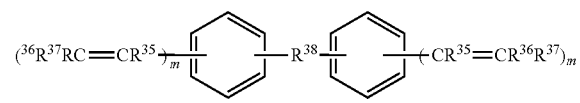

wherein $R^{35}$ to $R^{37}$ are as defined above, $R^{38}$ is a single bond, —$SO_2$—, —O—, —S—, —CO—, a heteroatom-containing group, a substituted or unsubstituted alkylene group, a substituted or unsubstituted cycloalkylene group or a substituted or unsubstituted arylene group, m is an integer of 1 to 5, and a part or all of these groups may be fluorinated.

The heteroatom-containing group is not limited as long as it is a divalent group containing a heteroatom. Examples of the heteroatom include an oxygen atom, a nitrogen atom, a sulfur atom, a boron atom, and a phosphorus atom.

Examples of the cross-linking agent used for polyol crosslinking include polyhydric alcohol compounds such as bisphenol A and bisphenol AF.

Examples of the cross-linking agent used for polyamine crosslinking include polyamine compounds such as hexamethylenediamine carbamate, N,N'-dicinenamiridene-1,6-hexanediamine, and 4,4'-bis(aminocyclohexyl)methane carbamate.

Examples of the cross-linking agent used for triazine crosslinking include organic tin compounds such as tetraphenyltin and triphenyltin.

Examples of the cross-linking agents used for oxazole crosslinking, imidazole crosslinking, and thiazole crosslinking include a bisdiaminophenyl-based cross-linking agent, a bis-aminophenol-based cross-linking agent, and a bis-aminothiophenol-based cross-linking agent represented by formula (41):

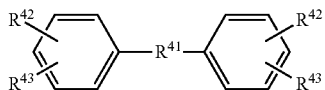

wherein $R^{41}$ is —$SO_2$—, —O—, —CO—, an alkylene group having 1 to 6 carbon atoms, a perfluoroalkylene group having 1 to 10 carbon atoms, a single bond, or a group represented by:

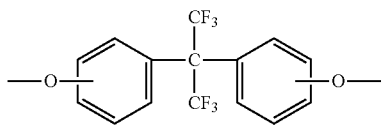

one of $R^{42}$ and $R^{43}$ is —$NH_2$ and the other is —$NHR^{44}$, —$NH_2$, —OH, or —SH, $R^{44}$ is a hydrogen atom, a fluorine atom, or a monovalent organic group, preferably $R^{42}$ is —$NH_2$ and $R^{43}$ is —$NHR^{44}$; preferred specific examples of the alkylene group having 1 to 6 carbon atoms include a methylene group, an ethylene group, a propylene group, a butylene group, a pentylene group, a hexylene group, and the like, and examples of the perfluoroalkylene group having 1 to 10 carbon atoms include:

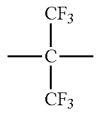

These compounds are known as examples of bisdiaminophenyl compounds in Japanese Patent Publication No. 2-59177, Japanese Patent Laid-open No. 8-120146, and the like;
a bisamidrazone-based cross-linking agent represented by formula (42):

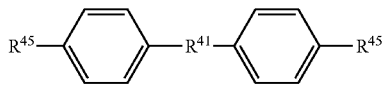

wherein $R^{41}$ is as defined above, and each $R^{45}$ is independently any one of the following groups:

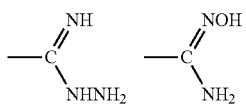

an amidrazone-based cross-linking agent represented by formula (43):

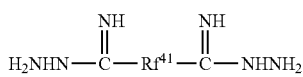

wherein $Rf^{41}$ is a perfluoroalkylene group having 1 to 10 carbon atoms; and a bisamidoxime-based cross-linking agent represented by formula (44):

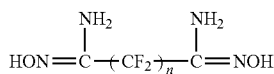

wherein n is an integer of 1 to 10, a compound represented by formula (45): $HN=CR^{45}R^{46}$, wherein $R^{45}$ is selected from the group consisting of H, $NH_2$, and $NHR^{47}$, $R^{46}$ is selected from the group consisting of Ph, $SO_2H$, $NR^{48}R^{49}$, 2-pyridine, and $CH_2CONH_2$, $R^{47}$ is selected from the group consisting of Ph, $NH_2$, and CN, $R^{48}$ is selected from the group consisting of H, NHPh, $CH_2CONH_2$, a linear alkyl group having 1 to 8 carbon atoms, and a branched alkyl group having 1 to 8 carbon atoms, and $R^{49}$ is selected from the group consisting of Ph, $COOC(CH_3)_3$, $NH_2$, $CH_2COOH$, $CSNH_2$, $CNHNH_3^+Cl^-$, p-phenyl CN,

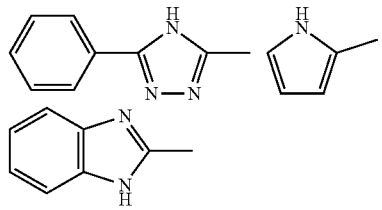

and COPh, and the like. These bisaminophenol-based cross-linking agents, bisaminothiophenol-based cross-linking agents, bisdiaminophenyl-based cross-linking agents, and the like have conventionally been used in crosslinking systems that use a cyano group as a crosslinking point, but these agents also react with a carboxyl group and an alkoxycarbonyl group to form an oxazole ring, a thiazole ring, and an imidazole ring to provide a crosslinked product.

Further, examples of the cross-linking agent include a cross-linking agent represented by formula (46): $X^{41}$—$(CH_2)_n$—$R^{50}$—$(CH_2)_m$—$X^{41}$, wherein each $X^{41}$ is independently an alkyne group, a nitrile group, or $Y^{41}{}_pN_3$, wherein $Y^{41}$ is SO, $SO_2$, $C_6H_4$, or CO, and p is 0 or 1, n and m are independently integers of 1 to 4, and $R^{50}$ is selected from the group consisting of
  i) a fluoroalkylene group having 3 to 10 carbon atoms,
  ii) a fluoralkoxylene group having 3 to 10 carbon atoms,
  iii) a substituted arylene group,
  iv) an oligomer including a copolymerization unit of vinylidene fluoride and perfluoro(methylvinylether),
  v) an oligomer including a copolymerization unit of vinylidene fluoride and hexafluoropropylene,
  vi) an oligomer including a copolymerization unit of tetrafluoroethylene and perfluoro(methylvinylether), and
  vii) an oligomer including a copolymerization unit of tetrafluoroethylene and a hydrocarbon olefin.

This cross-linking agent is preferably used together with a fluorine-containing elastomer having a nitrile group, an azide group, a sulfonyl azide group, a carbonyl azide group, or an alkyne group. For example, the nitrile group of the fluorine-containing elastomer reacts with the azide group of the cross-linking agent to form a tetrazole ring to provide a crosslinked product.

Examples of a particularly preferred cross-linking agent include a compound having a plurality of 3-amino-4-hydroxyphenyl groups or 3-amino-4-mercaptophenyl groups, or a compound represented by formula (47):

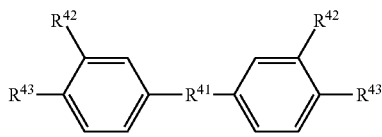

wherein $R^{41}$, $R^{42}$, and $R^{43}$ are as defined above. Specifically, examples include 2,2-bis(3-amino-4-hydroxyphenyl)hexafluoropropane (generic name: bis(aminophenol)AF), 2,2-bis(3-amino-4-mercaptophenyl) hexafluoropropane, tetraaminobenzene, bis-3,4-diaminophenylmethane, bis-3,4-diaminophenyl ether, 2,2-bis(3,4-diaminophenyl)hexafluoropropane, 2,2-bis[3-amino-4-(N-phenylamino)phenyl]hexafluoropropane, 2,2-bis[3-amino-4-(N-methylamino)phenyl]hexafluoropropane, 2,2-bis[3-amino-4-(N-ethylamino)phenyl]hexafluoropropane, 2,2-bis[3-amino-4-(N-propylamino)phenyl]hexafluoropropane, 2,2-bis[3-amino-4-(N-perfluorophenylamino)phenyl]hexafluoropropane, 2,2-bis[3-amino-4-(N-benzylamino)phenyl]hexafluoropropane, and the like.

Among these, from the viewpoints of heat resistance, steam resistance, amine resistance, and good crosslinkability, the cross-linking agent is preferably 2,2-bis[3-amino-4-(N-phenylamino)phenyl]hexafluoropropane.

The content of the cross-linking agent is, with respect to 100 parts by mass of the fluorine-containing polymer, preferably 0.05 to 10 parts by mass, and more preferably 0.5 to 5 parts by mass.

The composition may contain a filler (provided that the above-described silicon oxide is excluded).

Examples of the filler other than the silicon oxide include an imide-based filler having an imide structure such as polyimide, polyamideimide, and polyetherimide, an organic filler made of engineering plastic such as polyarylate, polysulfone, polyethersulfone, polyphenylene sulfide, polyether ether ketone, polyether ketone, and polyoxybenzoate, a metal oxide filler such as aluminum oxide ($Al_2O_3$), silicon oxide ($SiO_2$), and yttrium oxide, a metal carbide such as silicon carbide and aluminum carbide, a metal nitride filler such as silicon nitride and aluminum nitride, an inorganic filler such as aluminum fluoride, carbon fluoride, barium sulfate, carbon black, silica, clay, talc, and the like.

Among these, carbon black, aluminum oxide ($Al_2O_3$), silicon oxide ($SiO_2$), yttrium oxide, silicon nitride, silicon carbide, polyimide, and carbon fluoride are preferable from the viewpoint of a shield effect against various plasmas.

Further, the inorganic filler and organic filler may be used alone or blended in a combination of two or more thereof.

The amount of the filler other than the silicon oxide to be blended is preferably 0.5 to 100 parts by mass, and more preferably 5 to 50 parts by mass, with respect to 100 parts by mass of the fluorine-containing polymer.

Especially in fields not requiring high purity and non-contamination properties, an ordinary additive that is blended in the fluorine-containing polymer composition, such as a processing aid, a plasticizer, and a colorant, can optionally be blended. One or more common cross-linking agents and cross-linking aids different from those described above may also be blended.

The composition may contain an organic basic compound. Examples of the organic basic compound include
an octadecylamine of formula: $CH_3(CH_2)_{17}-NH_2$;
an erucamide of formula: $H_2N-C(O)-(CH_2)_{11}-CH=CH-(CH_2)_7CH_3$;
an oleamide of formula: $H_2N-C(O)-(CH_2)_7-CH=CH-(CH_2)_7CH_3$;
a hexamethylenediamine of formula: $H_2N-(CH_2)_6-NH_2$; and
a 1,8-diazabicycloundec-7-en (DBU) of formula:

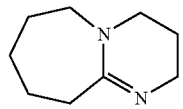

and the like.

The composition can be prepared by mixing each of the above-described components by using an ordinary polymer processing machine, for example, an open roll, a Banbury mixer, a kneader, or the like. In addition, the fluorine-containing elastomer composition can also be prepared by a method using a closed mixer.

The composition can be suitably used as a crosslinkable composition for obtaining a crosslinked product by crosslinking.

The crosslinked product of the present disclosure can be obtained by crosslinking the above-described composition. The composition for obtaining a crosslinked product preferably contains a cross-linking agent. The crosslinked product of the present disclosure can adsorb oxygen in the air. Therefore, by using the crosslinked product of the present disclosure as a sealing material or the like of an apparatus including a sealed space such as a semiconductor manufacturing apparatus, oxygen in the sealed space can be adsorbed to reduce the oxygen concentration in the sealed space, and oxygen can be prevented from entering the sealed space from the outside. Furthermore, the crosslinked product of the present disclosure contains a fluorine-containing polymer, and is thus also excellent in heat resistance and plasma resistance.

The ability of the crosslinked product to adsorb oxygen can be confirmed, for example, by a method for confirming the weight increase of the crosslinked product when the crosslinked product is heated in air. The fluorine-containing polymer contained in the crosslinked product has excellent heat resistance, and the weight hardly increases upon heating. Therefore, the composition of the present disclosure, which increase in weight upon heating in air, is a novel composition.

The above-described crosslinking can be performed in the order of primary crosslinking and secondary crosslinking. The primary crosslinking is preferably carried out at 150 to 200° C. for 5 to 120 minutes, and more preferably at 160 to 190° C. for 5 to 60 minutes. As the crosslinking means, known crosslinking means may be used, and examples thereof include press-crosslinking.

The secondary crosslinking is preferably carried out at 170 to 320° C. for 2 to 24 hours, and more preferably at 180 to 310° C. for 5 to 20 hours. As the crosslinking means, known crosslinking means may be used, and examples thereof include oven crosslinking. Further, by crosslinking in an inert gas such as nitrogen gas, the oxygen adsorption capacity of the obtained crosslinked product can be further improved.

The crosslinked product (molded article) may be obtained by molding the composition to obtain a preform, and then crosslinking the preform. The method for obtaining the preform by using the composition may be an ordinary method, and is pertained by a known method such as a method of heating and compressing in a mold, a method of press-fitting into a heated mold, and a method of extruding with an extruder. In the case of an extruded product such as a hose and an electric wire, the crosslinked product can be obtained by heating and crosslinking with steam or the like after extrusion.

The crosslinked product of the present disclosure can be suitably used as a sealing material for a semiconductor fabrication apparatus that particularly requires heat resistance, and particularly a semiconductor fabrication apparatus in which high-density plasma irradiation is performed. Examples of the sealing material include O-rings, square-rings, gasket, packing, oil seals, bearing seals, lip seals, and the like.

In addition, the molded article of the present disclosure can also be used as various polymer products used in semiconductor fabrication apparatus, such as diaphragms, tubes, hoses, various rubber rolls, and belts. Further, the molded article of the present disclosure can also be used as a coating material and a lining material.

As referred to herein, the "semiconductor fabrication apparatus" is not limited to an apparatus for fabricating semiconductors, and widely includes general fabrication apparatus used in the semiconductor field requiring a high level of cleanliness, such as apparatus for manufacturing liquid crystal panels and plasma panels. Examples thereof include the following.

(1) Etching Apparatus
  Dry etching apparatus
  Plasma etching apparatus
  Reactive ion etching apparatus
  Reactive ion beam etching apparatus
  Sputter etching apparatus
  Ion beam etching apparatus
  Wet etching apparatus
  Ashing apparatus
(2) Cleaning Apparatus Dry Etching Cleaning Apparatus
  UV/$O_3$ cleaning apparatus
  Ion beam cleaning apparatus
  Laser beam cleaning apparatus
  Plasma cleaning apparatus
  Gas etching cleaning apparatus
  Extraction and cleaning apparatus
  Soxhlet extraction cleaning apparatus
  High-temperature high-pressure extraction cleaning apparatus
  Microwave extraction cleaning apparatus
  Supercritical extraction cleaning apparatus
(3) Exposure Apparatus
  Stepper
  Coater/developer
(4) Polishing Apparatus
  CMP apparatus
(5) Film Formation Apparatus
  CVD apparatus
  Sputtering apparatus
(6) Diffusion/Ion Implantation Apparatus
  Oxidation diffusion apparatus
  Ion implantation apparatus The crosslinked product of the present disclosure exhibits excellent performance as a sealing material for, for example, a CVD apparatus, a plasma etching apparatus, a reactive ion etching apparatus, an ashing apparatus, and an excimer laser exposure machine.

Embodiments have been described above, but it will be understood that various modifications to the modes and details may be made without departing from the spirit and scope of the claims.

According to the present disclosure, there is provided a composition comprising a fluorine-containing polymer and a silicon oxide represented by formula: $SiO_x$, where $0<x<2$.

The constituent ratio of Si in the silicon oxide (Si/(Si+O)), as specified by X-ray photoelectron spectroscopy (ESCA) of the silicon oxide, is preferably 35 to 90 atom %.

In the composition of the present disclosure, a content of the silicon oxide is preferably 0.1 to 100 parts by mass with respect to 100 parts by mass of the fluorine-containing polymer.

In the composition of the present disclosure, a rate of weight increase when a temperature of a crosslinked product obtained by crosslinking the composition is increased from normal temperature to 400° C. at a rate of 10° C./min by heating the crosslinked product in air is preferably 0.1% or more.

The fluorine-containing polymer is preferably a fluorine-containing elastomer.

The composition of the present disclosure preferably further contains a cross-linking agent.

According to the present disclosure, there is also provided a crosslinked product obtained by crosslinking the above composition.

The crosslinked product of the present disclosure can be suitably used as a sealing material.

EXAMPLES

Next, embodiments of the present disclosure will be described with reference to examples, but the present disclosure is not limited to only these examples.

The numerical values in the examples were measured by the following methods.

Monomer Unit Compositional Feature of Fluorine-Containing Elastomer

The monomer unit compositional feature was measured $^{19}$F-NMR analysis was carried out.

Mooney Viscosity of Fluorine-Containing Elastomer

The Mooney viscosity was measured at 170° C. according to JIS K6300 by using a Mooney viscometer MV2000E manufactured by ALPHA TECHNOLOGIES.

Rate of Weight Increase

A test sample having a thickness of 2 mm was used to produce a sample for measuring rate of weight increase of 10 mg. The weight change of the sample was measured using a simultaneous the ogravimetry/differential thermal analyzer (TG/DTA7200 manufactured by SII NanoTechnology Inc.) under the conditions of air 200 ml/min, temperature-increasing rate of 10° C./min, and normal temperature to 600° C. A TG curve was drawn on a graph in which the vertical axis represents the weight change ratio (%) and the horizontal axis represents the temperature (° C.), and the weight increase at the time when the temperature reached 400° C.

was shown as a percentage with respect to the initial weight. A rate of weight increase of more than 0% means that the sample has adsorbed oxygen. In addition, a larger rate of weight increase means a larger oxygen adsorption of the sample.

Ordinary-State Properties

In accordance with JIS K6251, 100% tensile stress (MPa), tensile strength (MPa), elongation (%), and hardness Peak (Shore A) at ordinary state (25° C.) of a test sample having a thickness of 2 mm were measured.

Production Example (Production of Silicon Oxide)

A mixed powder of $SiO_2$ powder and Si powder was used as the raw material powder. Silicon oxide particles represented by formula: $SiC$ where $0<x<2$ were produced by generating a thermal plasma flame using hydrogen gas and argon gas as plasma gas, using argon gas as carrier gas, and supplying mixed powder to the thermal plasma flame.

The obtained particles were analyzed for the compositional feature of the elements constituting the particles with an X-ray photoelectron analyzer ESCA-3400 manufactured by Shimadzu Corporation. As a result, the constituent ratio of silicon and oxygen was 41 atomic % of silicon and 59 atomic % of oxygen.

The specific surface area of the obtained particles was measured using the BELSOAP-mini II specific surface area-pore distribution measuring apparatus manufactured by BEL JAPAN, INC., and the particle size of the obtained particles was converted from the specific surface area, and as a result, the particle size of the obtained particles was 22 nm.

Example 1

A crosslinkable composition was prepared by kneading with an open roll 100 parts by mass of a fluorine-containing elastomer (TFE/PMVE/$CF_2$=$CFOCF_2CF(CF_3)OCF_2CF_2CN$=59.3/39.9/0.8 (mol %), Mooney Viscosity (ML 1+20(170° C.))=80), 10 parts by mass of the silicon oxide obtained in Production Example, and 0.8 parts by mass of 4,4'-[2,2,2-trifluoro-1-(trifluoromethyl)ethylidene]bis[N1-phenyl-1,2-benzenediamine] as a cross-linking agent.

The obtained crosslinkable composition was pressed at 180° C. for 30 minutes to perform cross-linking, and further crosslinked in an oven at 290° C. for 18 hours in a nitrogen environment to produce a test sample of a crosslinked product having a thickness of 2 mm.

Ordinary-state properties of the obtained crosslinked product were measured by the above method. The results are shown in Table 1.

Furthermore, the weight change of the test sample of the obtained crosslinked product was measured by the above-mentioned method. As a result, the rate of weight increase was 0.18% when the temperature reached 400° C.

Example 2

A crosslinkable composition was prepared in the same manner as in Example 1 except that the content of the silicon oxide was changed to 20 parts by mass with respect to 100 parts by mass of the fluorine-containing elastomer, and a test sample of a crosslinked product having a thickness of 2 mm was produced. The results of the same evaluation are shown in Table 1. The rate of weight increase when the temperature reached 400° C. was 0.51%.

TABLE 1

|  | Example 1 | Example 2 |
| --- | --- | --- |
| Non-stoichiometric silicon oxide | | |
| Constituent ratio of Si (atom %) | 41 | 41 |
| Content (parts by mass) | 10 | 20 |
| Crosslinked product | | |
| 100% tensile stress (MPa) | 3.6 | 9.9 |
| Tensile strength (MPa) | 10.2 | 20.4 |
| Elongation (%) | 201 | 216 |
| Hardness Peak (Shore A) | 75 | 88 |

What is claimed is:

1. A composition comprising a fluorine-containing polymer, a cross-linking agent, and a silicon oxide represented by formula: $SiO_x$, where $0<x<2$, wherein
   the fluorine-containing polymer is a fluorine-containing elastomer,
   a content of the silicon oxide is 0.1 to 50 parts by mass with respect to 100 parts by mass of the fluorine-containing polymer, and
   a constituent ratio of Si in the silicon oxide (Si/(Si+O)), as specified by X-ray photoelectron spectroscopy (ESCA) of the silicon oxide, is 37 to 90 atom %.

2. The composition according to claim 1, wherein a rate of weight increase when a temperature of a crosslinked product obtained by crosslinking the composition is increased from normal temperature to 400° C. at a rate of 10° C./min by heating the crosslinked product in air is 0.1% or more.

3. A crosslinked product obtained by crosslinking the composition according to claim 1.

4. The crosslinked product according to claim 3, which is a sealing material.

* * * * *